(12) United States Patent
Lee et al.

(10) Patent No.: US 9,030,030 B2
(45) Date of Patent: *May 12, 2015

(54) SEMICONDUCTOR DEVICE AND METHOD OF FORMING ADJACENT CHANNEL AND DAM MATERIAL AROUND DIE ATTACH AREA OF SUBSTRATE TO CONTROL OUTWARD FLOW OF UNDERFILL MATERIAL

(71) Applicant: STATS ChipPAC, Ltd., Singapore (SG)

(72) Inventors: KyungHoon Lee, Kyunggi-Do (KR); KiYoun Jang, Kyoungki-Do (KR); JoonDong Kim, Kyunggi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/760,187

(22) Filed: Feb. 6, 2013

(65) Prior Publication Data

US 2013/0147065 A1 Jun. 13, 2013

Related U.S. Application Data

(63) Continuation of application No. 12/768,177, filed on Apr. 27, 2010, now Pat. No. 8,399,300.

(51) Int. Cl.
*H01L 23/498* (2006.01)
*H01L 21/56* (2006.01)
*H01L 23/13* (2006.01)
*H01L 23/31* (2006.01)
*H01L 21/50* (2006.01)
*H01L 23/00* (2006.01)

(52) U.S. Cl.
CPC ........ *H01L 23/49811* (2013.01); *H01L 21/563* (2013.01); *H01L 23/13* (2013.01); CPC *H01L23/3121* (2013.01); *H01L 23/3128* (2013.01); *H01L 23/49816* (2013.01); *H01L 23/49827* (2013.01); *H01L 24/16* (2013.01); *H01L 24/73* (2013.01); *H01L 24/81* (2013.01); *H01L 2224/16225* (2013.01); *H01L 2224/16235* (2013.01); *H01L 2224/73203* (2013.01); *H01L 2224/73204* (2013.01); *H01L 2224/81815* (2013.01); *H01L 2224/83051* (2013.01); *H01L 2224/83385* (2013.01); *H01L 2924/15311* (2013.01); *H01L 2924/01079* (2013.01); *H01L 2924/01322* (2013.01); *H01L 2224/32225* (2013.01); *H01L 2924/13091* (2013.01); *H01L 21/50* (2013.01); *H01L 2224/26175* (2013.01)

(58) Field of Classification Search
CPC .............. H01L 21/563; H01L 23/3157; H01L 23/3178; H01L 21/50; H01L 23/13; H01L 23/3121; H01L 23/3128; H01L 23/49811; H01L 23/49827
USPC .................. 257/778, 783, E21.503, E21.511, 257/E23.023; 438/118

See application file for complete search history.

(56) References Cited

U.S. PATENT DOCUMENTS 6,291,264 B1  9/2001  Tang et al.
6,400,036 B1  6/2002  Tang et al.

(Continued)

FOREIGN PATENT DOCUMENTS

| CN | 1921101 | 8/2006 |
|---|---|---|
| JP | 05-299535 | 12/1993 |
| JP | 11150206 A | 6/1999 |
| SG | 136808 | 11/2007 |

*Primary Examiner* — Allan R Wilson
(74) *Attorney, Agent, or Firm* — Robert D. Atkins; Patent Law Group: Atkins and Associates, P.C.

(57) ABSTRACT

A semiconductor device has a flipchip or PoP semiconductor die mounted to a die attach area interior to a substrate. The substrate has a contact pad area around the die attach area and flow control area between the die attach area and contact pad area. A first channel is formed in a surface of the substrate within the flow control area. The first channel extends around a periphery of the die attach area. A first dam material is formed adjacent to the first channel within the flow control area. An underfill material is deposited between the die and substrate. The first channel and first dam material control outward flow of the underfill material to prevent excess underfill material from covering the contact pad area. A second channel can be formed adjacent to the first dam material. A second dam material can be formed adjacent to the first channel.

25 Claims, 9 Drawing Sheets

(56) References Cited

U.S. PATENT DOCUMENTS

| | | |
|---|---|---|
| 6,614,122 B1 | 9/2003 | Dory et al. |
| 6,853,089 B2 | 2/2005 | Ujiie et al. |
| 6,946,741 B2 | 9/2005 | Yamashita |
| 7,122,893 B2 * | 10/2006 | Weng et al. ............... 257/730 |
| 7,179,683 B2 | 2/2007 | Low et al. |
| 7,221,059 B2 | 5/2007 | Farnworth et al. |
| 7,564,140 B2 | 7/2009 | Lee et al. |
| 8,421,211 B2 * | 4/2013 | Kang et al. ............... 257/693 |
| 2005/0051885 A1 * | 3/2005 | Weng et al. ............... 257/687 |
| 2007/0045870 A1 | 3/2007 | Kuramochi |
| 2008/0211111 A1 | 9/2008 | Park et al. |
| 2009/0154128 A1 * | 6/2009 | Tamadate ............... 361/783 |
| 2009/0189268 A1 * | 7/2009 | Kado et al. ............... 257/686 |
| 2010/0139962 A1 * | 6/2010 | Kaneko ............... 174/260 |
| 2010/0155965 A1 | 6/2010 | Igarashi |
| 2010/0301464 A1 * | 12/2010 | Arshad ............... 257/676 |
| 2011/0095421 A1 * | 4/2011 | Kim et al. ............... 257/737 |
| 2011/0115083 A1 | 5/2011 | Zang et al. |
| 2011/0260336 A1 * | 10/2011 | Kang et al. ............... 257/777 |
| 2013/0147065 A1 | 6/2013 | Lee et al. |

* cited by examiner

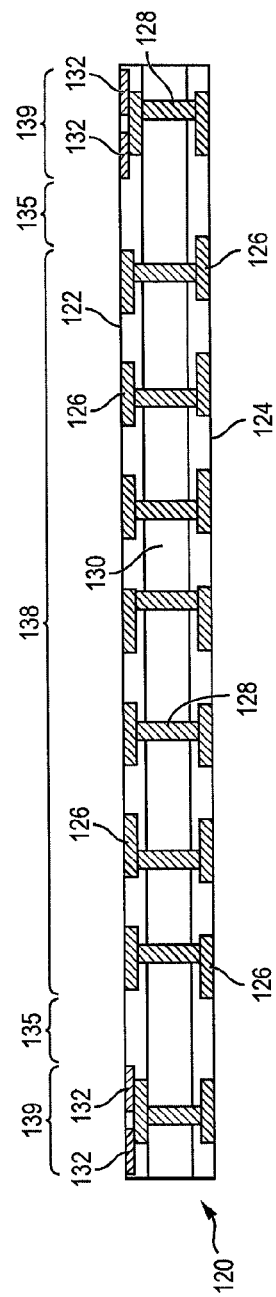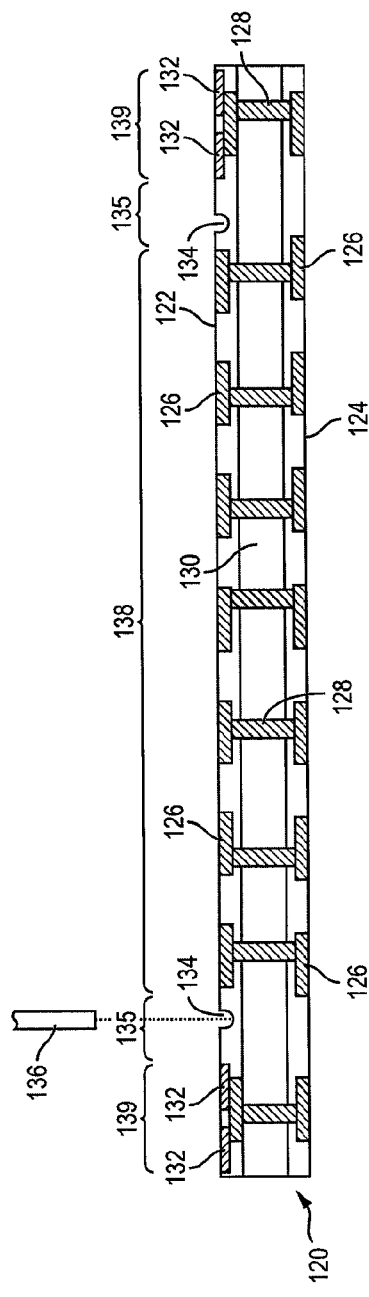
FIG. 3a
FIG. 3b

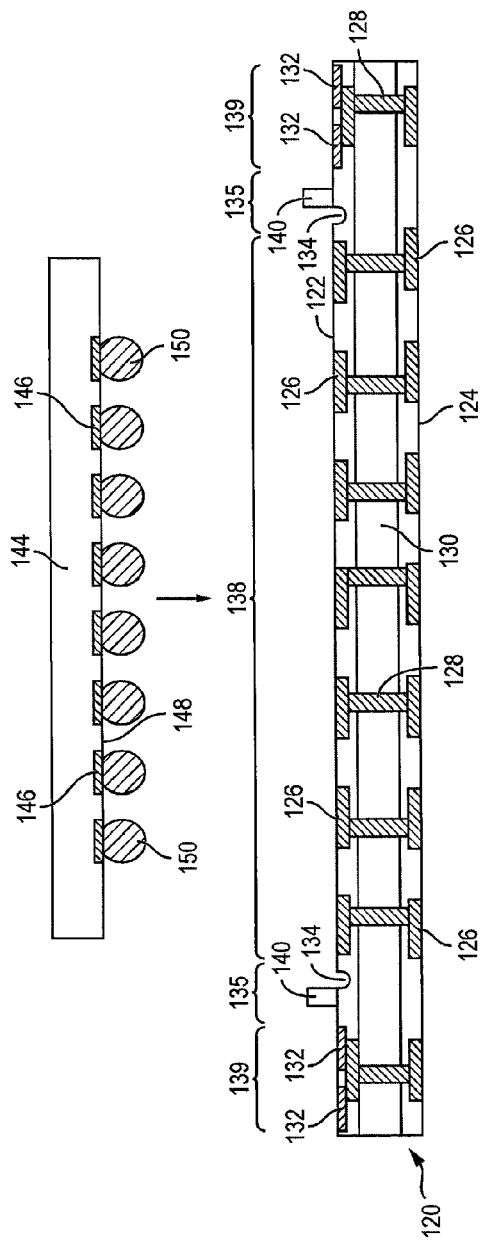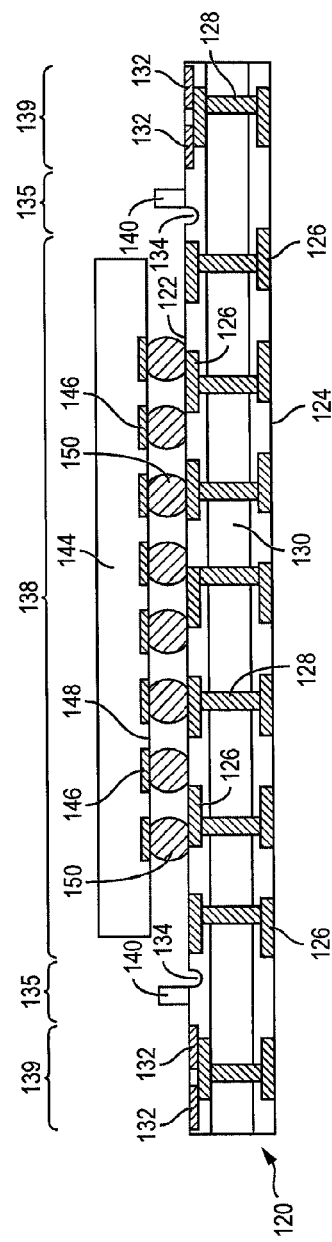
FIG. 3e
FIG. 3f

SEMICONDUCTOR DEVICE AND METHOD OF FORMING ADJACENT CHANNEL AND DAM MATERIAL AROUND DIE ATTACH AREA OF SUBSTRATE TO CONTROL OUTWARD FLOW OF UNDERFILL MATERIAL

CLAIM TO DOMESTIC PRIORITY

The present application is a continuation of U.S. patent application Ser. No. 12/768,177, now U.S. Pat. No. 8,399,300, filed Apr. 27, 2010, which application is incorporated herein by reference.

FIELD OF THE INVENTION

The present invention relates in general to semiconductor devices and, more particularly, to a semiconductor device and method of forming adjacent channel and dam material around a die attach area on a substrate to control outward flow of excess underfill material.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

A semiconductor die or package is commonly mounted to a substrate or PCB. In the case of a flipchip type semiconductor die, the bumps formed on the active surface of the die are metallurgically and electrically connected to contact pads on the substrate. The void between the semiconductor die and substrate can be filled with an underfill material for structural support and environmental isolation. Dispensing the proper amount of underfill material is difficult to control. Excess underfill material typically bleeds out or flows outward, beyond the footprint of the semiconductor die. The excess underfill material may unintentionally cover other portions of the substrate, such as contact pads in proximity of the die but outside the footprint of the die. Dam materials have been formed around the semiconductor die to attempt to hold back the excess underfill material. Due to the difficulty in dispensing the proper amount of underfill material, dam material alone is often insufficient to control the outward flow of excess underfill material.

SUMMARY OF THE INVENTION

A need exists to control outward flow of excess underfill material from the die attach area of the substrate. Accordingly, in one embodiment, the present invention is a method of making a semiconductor device comprising the steps of providing a substrate including a die attach area, forming a first channel in the substrate, forming a first dam material over the substrate, disposing a semiconductor die over the die attach area of the substrate, and depositing an underfill material between the semiconductor die and substrate. The first channel and first dam material control outward flow of excess underfill material.

In another embodiment, the present invention is a method of making a semiconductor device comprising the steps of providing a substrate including a die attach area, forming a first channel in the substrate, and forming a first dam material over the substrate.

In another embodiment, the present invention is a semiconductor device comprising a substrate including a die attach area. A first channel is formed in the substrate. A first dam material is formed over the substrate. A semiconductor die is disposed over the die attach area of the substrate. An underfill material is deposited between the semiconductor die and substrate. The first channel and first dam material control outward flow of excess underfill material.

In another embodiment, the present invention is a semiconductor device comprising a substrate including a die attach area. A first channel is formed in the substrate. A first dam material is formed over the substrate.

BRIEF DESCRIPTION OF THE DRAWINGS

FIGS. 3a-3h illustrate a process of forming adjacent channel and dam material around a die attach area on a substrate to control outward flow of excess underfill material;

DETAILED DESCRIPTION OF THE DRAWINGS

Figure 1:
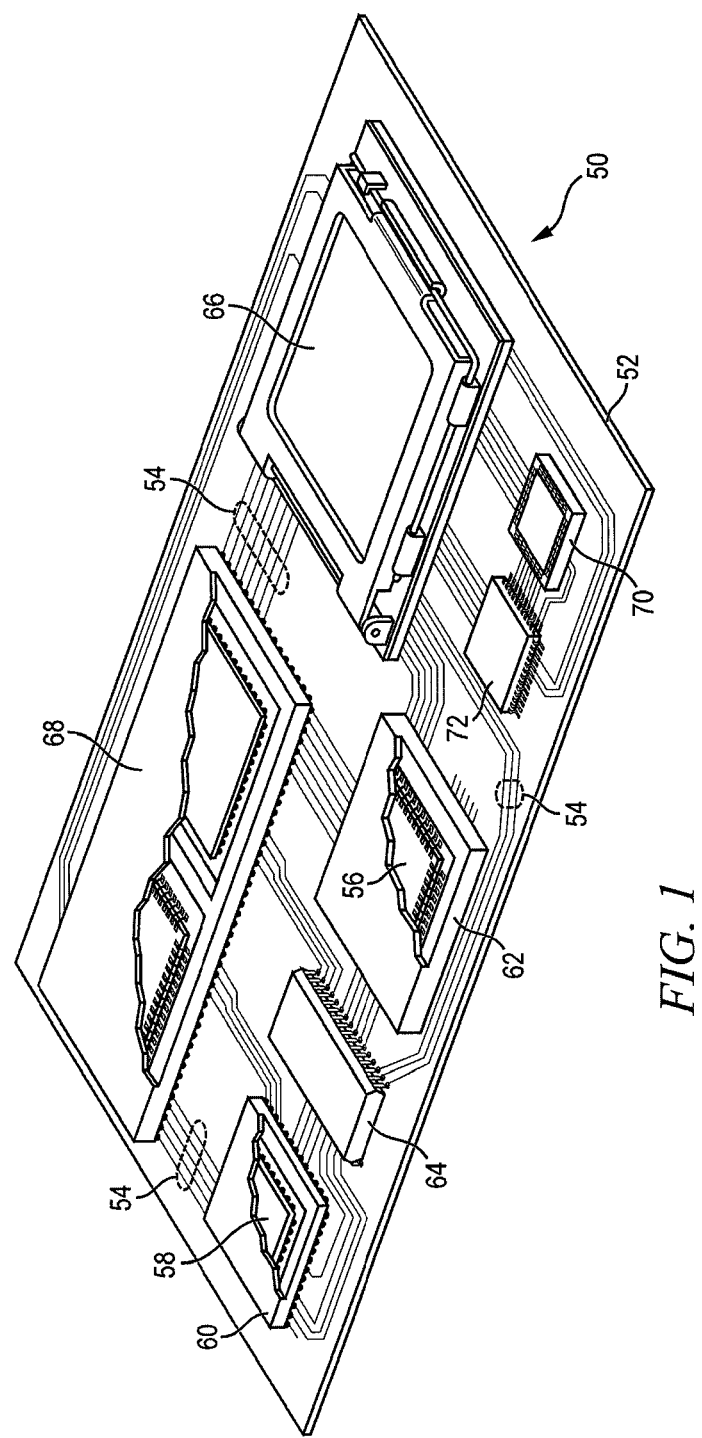
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
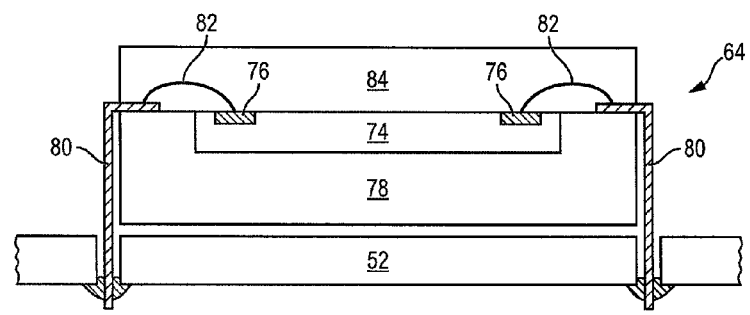
FIGS. 2a-2c illustrate further detail of the representative semiconductor packages mounted to the PCB.
Figure 2B:
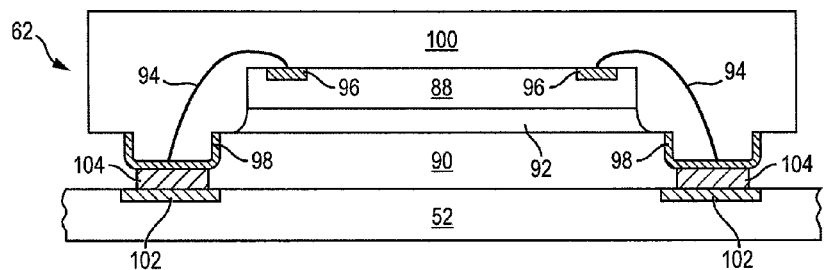
Figure 2C:
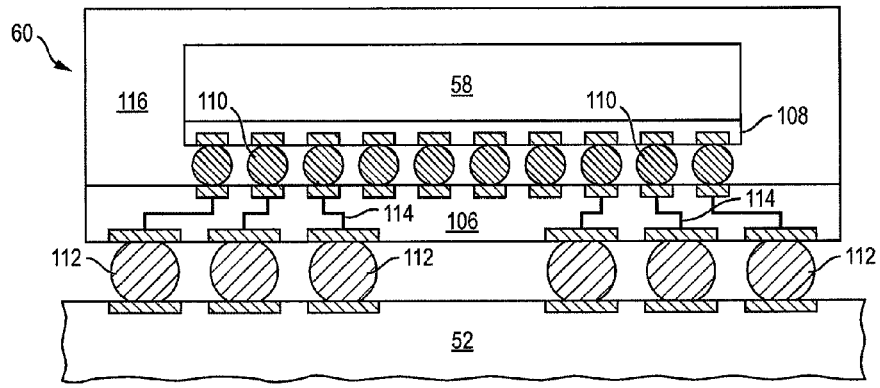

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3C:
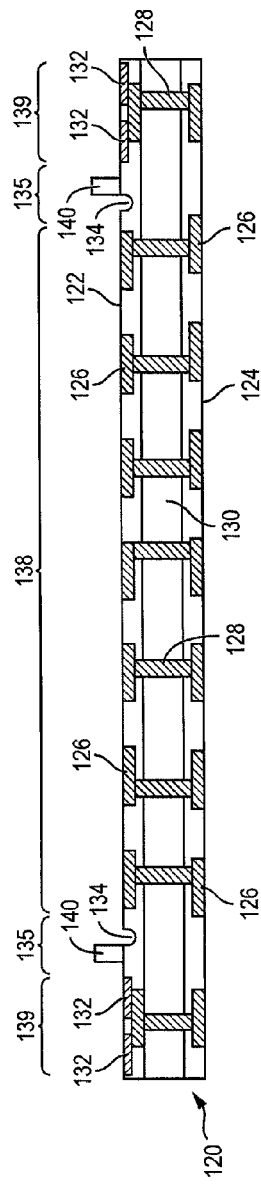

FIGS. 3a-3g illustrate, in relation to FIGS. 1 and 2a-2c, a process of forming adjacent channel and dam material around a die attach area on a substrate to control outward flow of excess underfill material. FIG. 3a shows a substrate or PCB 120 having top surface 122 and opposing bottom surface 124. Substrate 120 includes horizontal conductive layers 126 and vertical conductive layers 128 formed over and within insulating or dielectric material 130. In addition, a plurality of contact pads 132 is formed in top surface 122 of substrate 120. Substrate 120 provides structural support and electrical interconnect through conductive layers 126 and 128 and contact pads 132 for a semiconductor die.

In FIG. 3b, top surface 122 of substrate 120 has a die attach area 138 designated for mounting a semiconductor die and contact pad area 139 occupied by contact pads 132. The die attach area 138 is generally located within an interior space of substrate 120. Contact pad area 139 is located around die attach area 138, outside a footprint of the semiconductor die, e.g., around a periphery of substrate 120. A flow control area 135 located between die attach area 138 and contact pad area 139 is designated for controlling outward flow of excess underfill material. A groove or channel 134 is cut into insulating material 130 of substrate 120 using saw blade or laser cutting tool 136. Channel 134 is formed partially or completely around a periphery of die attach area 138 within flow control area 135, i.e., between die attach area 138 and contact pad area 139.

In FIG. 3c, a dam material 140 is formed adjacent to channel 134 within flow control area 135. In this case, dam material 140 is formed partially or completely around a periphery of channel 134, i.e., on the side of the channel proximate to contact pad area 139. Dam material 140 can be solder resist, adhesive, insulation, polymer, metal, or other suitable barrier material. Dam material 140 is formed by screen printing, electrolytic plating, electroless plating, spray coating, or other suitable deposition process depending on the material.

In one embodiment, channel 134 has a depth a minimum of 5 micrometers (μm) into insulating layer 130 and dam material 140 has a height a minimum of 5 μm extending above top surface 122.

Figure 3D:
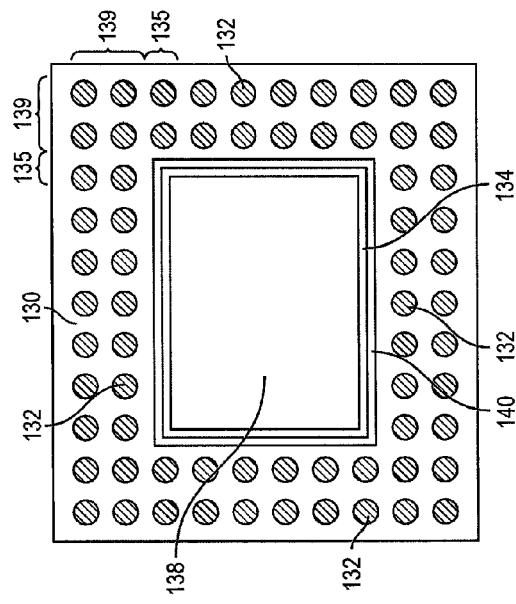

FIG. 3d shows a top view of substrate 120 with channel 134 formed around the periphery of die attach area 138 and dam material 140 formed around the periphery of channel 134 proximate to contact pad area 139. Channel 134 and dam material 140 are both within flow control area 135.

FIG. 3e shows a semiconductor die or component 144 having contact pads 146 formed over active surface 148 oriented downward toward substrate 120. A plurality of bumps 150 is formed over contact pads 146. Active surface 148 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 148 to implement analog circuits or digital circuits, such as digital signal processor (DSP), ASIC, memory, or other signal processing circuit. Semiconductor die 144 may also contain IPD, such as inductors, capacitors, and resistors, for RF signal processing.

In FIG. 3f, semiconductor die 144 is aligned to die attach area 138 and mounted to substrate 120 by reflowing bumps 150 to metallurgically and electrically connect the bumps to conductive layer 126. In one embodiment, semiconductor die 144 is a flipchip type semiconductor die. Alternatively, a package-on-package (PoP) semiconductor device can be mounted to die attach area 138 of substrate 120. Contact pads 132 are electrically connected to conductive layers 126 and 128 depending on the electrical design and function of semiconductor die 144. Contact pads 132 provide additional electrical interconnect from substrate 120 to external circuit components.

Figure 3G:
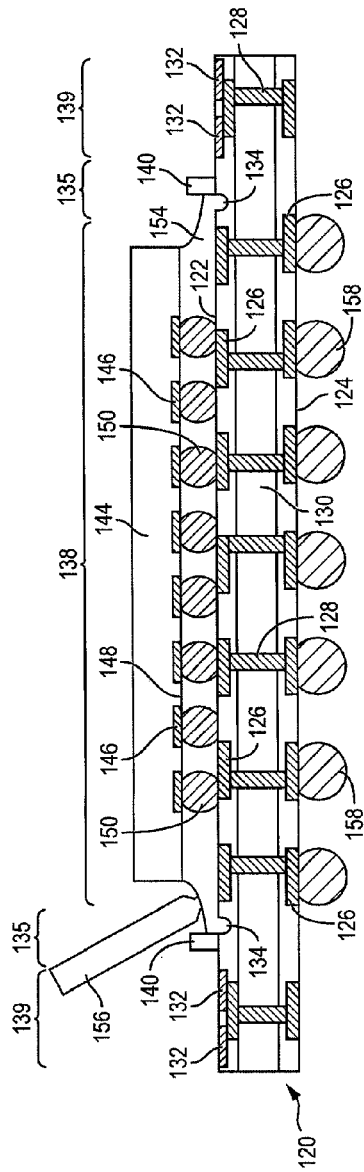
Figure 3H:
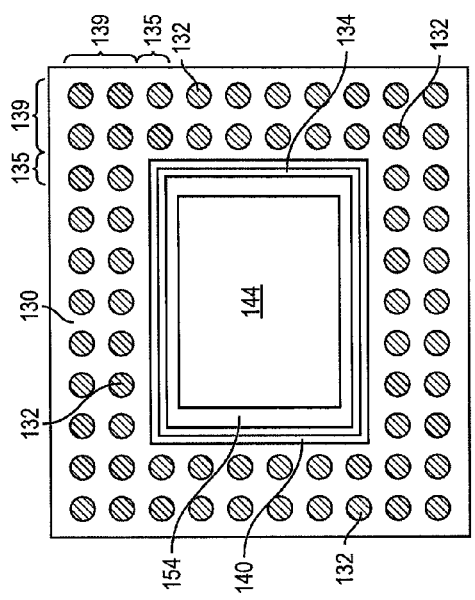

In FIG. 3g, an underfill material 154 such as epoxy or adhesive is deposited between substrate 120 and semiconductor die 144 with dispenser 156. Channel 134 and dam material 140 control the outward flow of underfill material 154 to prevent excess underfill material from reaching contact pad area 139 and covering contact pads 132. The depth of channel 134 and height of dam material 140 can be selected to control the outward flow of excess underfill material 154. FIG. 3h shows a top view of channel 134 and dam material 140 controlling the outward flow of excess underfill material 154. Contact pads 132 remain devoid of underfill material 154 for good electrical connection from substrate 120 to external components.

An electrically conductive bump material is deposited over conductive layer 126 formed over bottom surface 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 126 using a suitable attachment or bonding process. In one embodiment, the bump material is reflowed by heating the material above its melting point to form spherical balls or bumps 158. In some applications, bumps 158 are reflowed a second time to improve electrical contact to conductive layer 126. The bumps can also be compression bonded to conductive layer 126. Bumps 158 represent one type of interconnect structure that can be formed over conductive layer 126. The interconnect structure can also use bond wires, stud bump, micro bump, or other electrical interconnect.

Figure 4A:
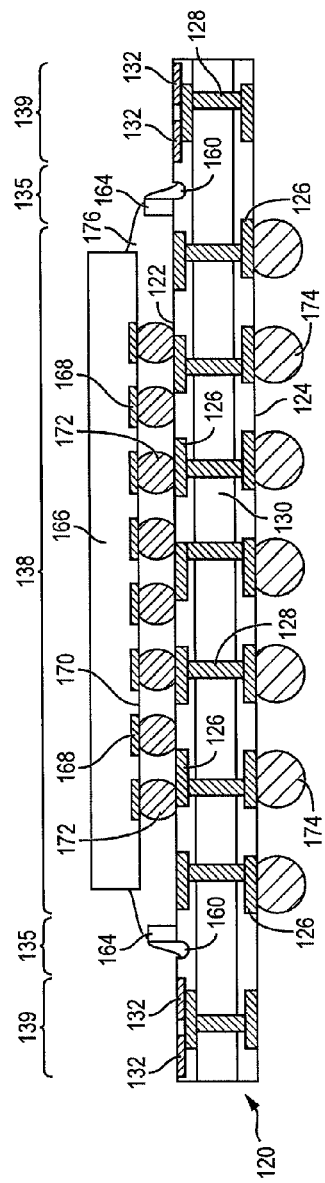
FIGS. 4a-4b illustrate another embodiment of the adjacent channel and dam material around the die attach area.

Another embodiment of the channel and dam material is shown in FIG. 4a. Continuing from the structure shown in FIG. 3a, a groove or channel 160 is cut into insulating material 130 of substrate 120 using a saw blade or laser cutting tool, similar to FIG. 3b. Channel 160 is formed partially or completely around a periphery of die attach area 138 within flow control area 135.

A dam material 164 is formed adjacent to channel 160 within flow control area 135. In this case, dam material 164 is formed partially or completely around a periphery of die attach area 138, i.e., on the side of the channel proximate to the die attach area. Dam material 164 can be solder resist, adhesive, insulation, polymer, metal, or other suitable barrier material. Dam material 164 is formed by screen printing, electrolytic plating, electroless plating, spray coating, or other suitable deposition process depending on the material. In one embodiment, channel 160 has a depth a minimum of 5 μm into insulating layer 130 and dam material 164 has a height a minimum of 5 μm extending above top surface 122.

Similar to FIG. 3e, a semiconductor die or component 166 has contact pads 168 formed over active surface 170 oriented downward toward substrate 120. A plurality of bumps 172 is formed over contact pads 168. Active surface 170 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 170 to implement analog circuits or digital circuits, such as DSP, ASIC, memory, or other signal processing circuit. Semiconductor die 166 may also contain IPD, such as inductors, capacitors, and resistors, for RF signal processing.

Semiconductor die 166 is aligned to die attach area 138 and mounted to substrate 120 by reflowing bumps 172 to metallurgically and electrically connect the bumps to conductive layer 126. In one embodiment, semiconductor die 166 is a flipchip type semiconductor die. Alternatively, a PoP semiconductor device can be mounted to die attach area 138 of substrate 120. A plurality of bumps 174 is formed over conductive layer 126 on bottom surface 124. Contact pads 132 are electrically connected to conductive layers 126 and 128 depending on the electrical design and function of semiconductor die 166. Contact pads 132 provide additional electrical interconnect from substrate 120 to external circuit components.

Figure 4B:
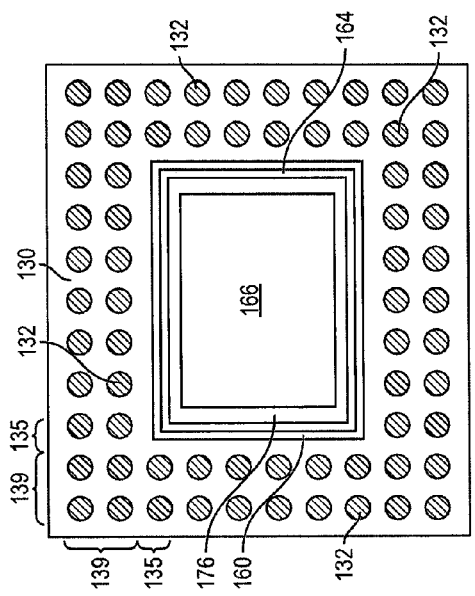

An underfill material 176 such as epoxy or adhesive is deposited between substrate 120 and semiconductor die 166 with a dispenser, similar to FIG. 3g. Channel 160 and dam material 164 control the outward flow of underfill material 176 to prevent excess underfill material from reaching contact pad area 139 and covering contact pads 132. The depth of channel 160 and height of dam material 164 can be selected to control the outward flow of excess underfill material 176. FIG. 4b shows a top view of channel 160 and dam material 164 controlling the outward flow of excess underfill material 176. Contact pads 132 remain devoid of underfill material 176 for good electrical connection from substrate 120 to external components.

Figure 5A:
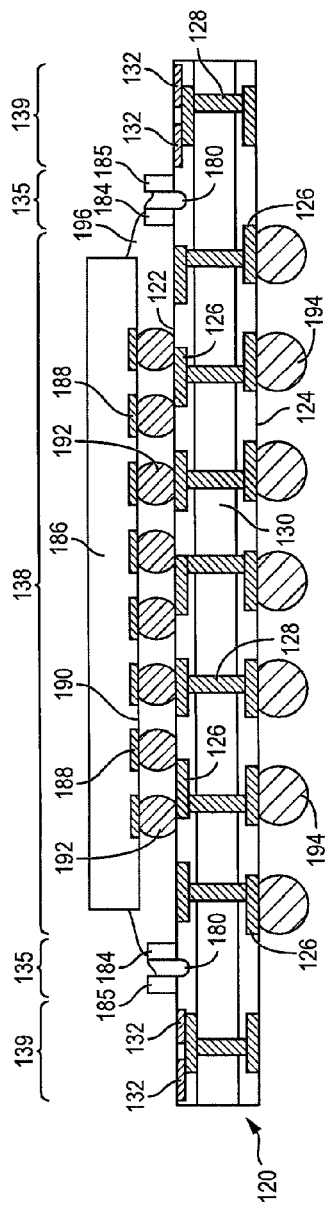
FIGS. 5a-5b illustrate two dam materials adjacent to a channel around the die attach area.

Another embodiment of the channel and dam material is shown in FIG. 5a. Continuing from the structure shown in FIG. 3a, a groove or channel 180 is cut into insulating material 130 of substrate 120 using a saw blade or laser cutting tool, similar to FIG. 3b. Channel 180 is formed partially or completely around a periphery of die attach area 138 within flow control area 135.

A dam material 184 is formed adjacent to channel 180 within flow control area 135. In this case, dam material 184 is formed partially or completely around die attach area 138, i.e., on the side of the channel proximate to the die attach area. A dam material 185 is formed within flow control area 135 partially or completely around a periphery of channel 180 opposite dam material 184, i.e., on the side of the channel proximate to contact pad area 139. Dam materials 184 and 185 can be solder resist, adhesive, insulation, polymer, metal, or other suitable barrier material. Dam material 184 and 185 are formed by screen printing, electrolytic plating, electroless plating, spray coating, or other suitable deposition process depending on the material. In one embodiment, channel 180 has a depth a minimum of 5 μm into insulating layer 130 and dam materials 184 and 185 have a height a minimum of 5 μm extending above top surface 122.

Similar to FIG. 3e, a semiconductor die or component 186 has contact pads 188 formed over active surface 190 oriented downward toward substrate 120. A plurality of bumps 192 is formed over contact pads 188. Active surface 190 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 190 to implement analog circuits or digital circuits, such as DSP, ASIC, memory, or other signal processing circuit. Semiconductor die 186 may also contain IPD, such as inductors, capacitors, and resistors, for RF signal processing.

Semiconductor die 186 is aligned to die attach area 138 and mounted to substrate 120 by reflowing bumps 192 to metallurgically and electrically connect the bumps to conductive layer 126. In one embodiment, semiconductor die 186 is a flipchip type semiconductor die. Alternatively, a PoP semiconductor device can be mounted to die attach area 138 of substrate 120. A plurality of bumps 194 is formed over conductive layer 126 on bottom surface 124. Contact pads 132 are electrically connected to conductive layers 126 and 128 depending on the electrical design and function of semiconductor die 186. Contact pads 132 provide additional electrical interconnect from substrate 120 to external circuit components.

Figure 5B:
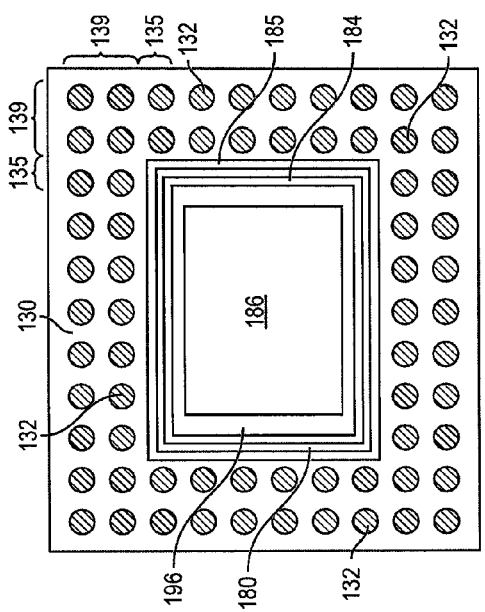

An underfill material 196 such as epoxy or adhesive is deposited between substrate 120 and semiconductor die 186 with a dispenser, similar to FIG. 3g. Channel 180 and dam materials 184 and 185 control the outward flow of underfill material 196 to prevent excess underfill material from reaching contact pad area 139 and covering contact pads 132. The depth of channel 180 and height of dam materials 184 and 185 can be selected to control the outward flow of excess underfill material 196. FIG. 5b shows a top view of channel 180 and dam materials 184 and 185 controlling the outward flow of excess underfill material 196. Contact pads 132 remain devoid of underfill material 196 for good electrical connection from substrate 120 to external components.

Figure 6A:
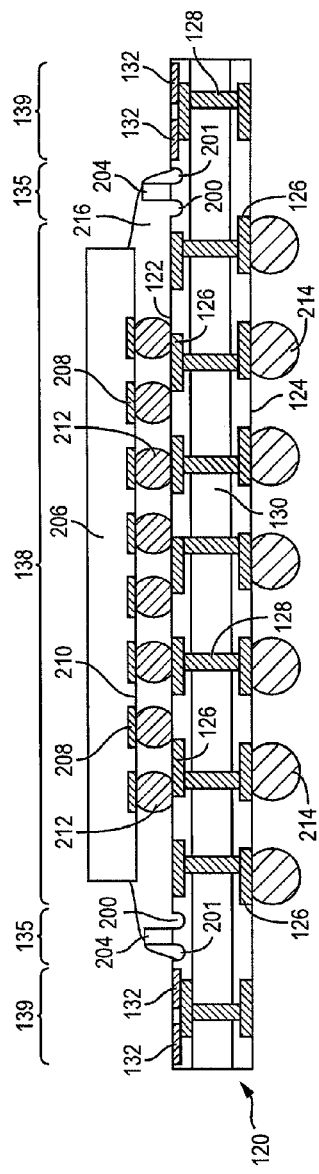
FIGS. 6a-6b illustrate two channels adjacent to dam material around the die attach area.

Another embodiment of the channel and dam material is shown in FIG. 6a. Continuing from the structure shown in FIG. 3a, a groove or channel 200 is cut into insulating material 130 of substrate 120 using a saw blade or laser cutting tool, similar to FIG. 3b. Another channel 201 is cut into insulating material 130 of substrate 120 around a periphery of channel 200 proximate to contact pad area 139, with a separation from channel 200. Channels 200 and 201 are formed partially or completely around a periphery of die attach area 138 within flow control area 135.

A dam material 204 is formed partially or completely around the separation between channels 200 and 201, within flow control area 135. Dam material 204 can be solder resist, adhesive, insulation, polymer, metal, or other suitable barrier material. Dam material 204 is formed by screen printing, electrolytic plating, electroless plating, spray coating, or other suitable deposition process depending on the material. In one embodiment, channels 200 and 201 have a depth a minimum of 5 μm into insulating layer 130 and dam material 204 has a height a minimum of 5 μm extending above top surface 122.

Similar to FIG. 3e, a semiconductor die or component 206 has contact pads 208 formed over active surface 210 oriented downward toward substrate 120. A plurality of bumps 212 is formed over contact pads 208. Active surface 210 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 210 to implement analog circuits or digital circuits, such as DSP, ASIC, memory, or other signal processing circuit. Semiconductor die 206 may also contain IPD, such as inductors, capacitors, and resistors, for RF signal processing.

Semiconductor die 206 is aligned to die attach area 138 and mounted to substrate 120 by reflowing bumps 212 to metallurgically and electrically connect the bumps to conductive layer 126. In one embodiment, semiconductor die 206 is a flipchip type semiconductor die. Alternatively, a PoP semiconductor device can be mounted to die attach area 138 of substrate 120. A plurality of bumps 214 is formed over conductive layer 126 on bottom surface 124. Contact pads 132 are electrically connected to conductive layers 126 and 128 depending on the electrical design and function of semiconductor die 206. Contact pads 132 provide additional electrical interconnect from substrate 120 to external circuit components.

Figure 6B:
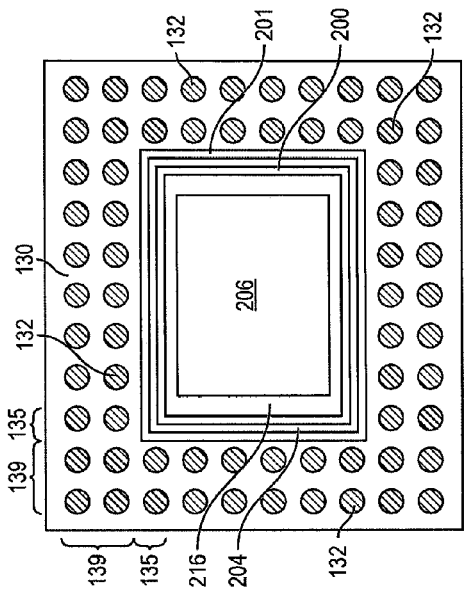

An underfill material 216 such as epoxy or adhesive is deposited between substrate 120 and semiconductor die 206 with a dispenser, similar to FIG. 3g. Channels 200 and 201 and dam material 204 control the outward flow of underfill material 216 to prevent excess underfill material from reaching contact pad area 139 and covering contact pads 132. The depth of channels 200 and 201 and height of dam material 204 can be selected to control the outward flow of excess underfill material 216. FIG. 6b shows a top view of channels 200 and 201 and dam material 204 controlling the outward flow of excess underfill material 216. Contact pads 132 remain devoid of underfill material 216 for good electrical connection from substrate 120 to external components.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
    providing a substrate including a die attach area and a contact pad formed over a surface of the substrate;
    forming a conductive via through the substrate and connected to the contact pad;
    cutting a first channel into the surface of the substrate between the die attach area and contact pad;
    forming a first dam material over the substrate;

disposing a semiconductor die over the die attach area of the substrate; and depositing an underfill material between the semiconductor die and substrate, wherein the first channel and first dam material control outward flow of excess underfill material.

2. The method of claim 1, further including forming the first dam material between the first channel and contact pad.

3. The method of claim 1, further including forming a second channel into the surface of the substrate.

4. The method of claim 1, further including forming the first dam material between the first channel and die attach area.

5. The method of claim 1, further including forming a second dam material over the substrate.

6. The method of claim 1, wherein the semiconductor die includes a flipchip type semiconductor die or package-on-package semiconductor device.

7. A method of making a semiconductor device, comprising:
providing a substrate including an insulating material;
forming a first channel into a surface of the substrate and partially through the insulating material; and
forming a first dam material over the substrate.

8. The method of claim 7, further including:
disposing a semiconductor die over the substrate; and
depositing an underfill material between the semiconductor die and substrate.

9. The method of claim 7, further including forming the first dam material between the first channel and a contact pad formed over the surface of the substrate.

10. The method of claim 7, further including forming a second channel into the substrate.

11. The method of claim 7, further including forming the first channel using a saw blade or laser cutting tool.

12. The method of claim 7, further including forming a second dam material over the substrate.

13. The method of claim 7, further including disposing a package-on-package semiconductor device over the substrate.

14. A semiconductor device, comprising:
a substrate including a contact pad;
a conductive via formed through the substrate and connected to the contact pad;
a first channel formed partially into a first surface of the substrate;
a first dam material formed over the first surface of the substrate; and
a bump formed over a second surface of the substrate opposite the first surface of the substrate and connected to the conductive via.

15. The semiconductor device of claim 14, further including:
a semiconductor die disposed over the substrate; and
an underfill material deposited between the semiconductor die and substrate.

16. The semiconductor device of claim 14, further including a second channel formed into the substrate.

17. The semiconductor device of claim 14, wherein the first dam material is formed between the first channel and the contact pad.

18. The semiconductor device of claim 14, further including a second dam material formed over the substrate.

19. The semiconductor device of claim 15, wherein the semiconductor die includes a flipchip type semiconductor die or package-on-package semiconductor device.

20. A semiconductor device, comprising:
a substrate including an insulating material;
a first channel formed in a first surface of the substrate and partially through the insulating material; and
a first dam material formed over the substrate.

21. The semiconductor device of claim 20, further including:
a semiconductor die disposed over the substrate; and
an underfill material deposited between the semiconductor die and substrate.

22. The semiconductor device of claim 20, an interconnect structure formed over a second surface of the substrate opposite the first surface of the substrate.

23. The semiconductor device of claim 20, further including a second channel formed into the insulating material.

24. The semiconductor device of claim 20, wherein the first dam material is formed between the first channel and a contact pad of the substrate.

25. The semiconductor device of claim 20, further including a second dam material formed over the substrate.

* * * * *